United States Patent [19]
Morikawa et al.

[11] Patent Number: 5,783,839
[45] Date of Patent: Jul. 21, 1998

[54] SEMICONDUCTOR DEVICE HAVING A GESC LAYER BETWEEN SILICON LAYERS WITH TRIANGULAR GE CONCENTRATION

[75] Inventors: Takenori Morikawa; Tsutomu Tashiro, both of Tokyo, Japan

[73] Assignee: NEC Corporation, Tokyo, Japan

[21] Appl. No.: 821,926

[22] Filed: Mar. 21, 1997

[30] Foreign Application Priority Data

Mar. 22, 1996 [JP] Japan ................. 8-066861

[51] Int. Cl.$^6$ ................. H01L 29/06
[52] U.S. Cl. ................. 257/21; 257/19; 257/55; 257/63; 257/458; 257/65; 257/461; 438/37; 438/87; 438/933
[58] Field of Search ................. 257/19, 21, 53, 257/55, 63, 65, 82, 85, 233, 292, 424, 436, 458, 461, 462; 438/37, 87, 933

[56] References Cited

U.S. PATENT DOCUMENTS 4,529,455  7/1985  Bean et al. ................. 148/175
4,772,924  9/1988  Bean et al. ................. 257/19
5,691,546  11/1997  Morishita ................. 257/19

FOREIGN PATENT DOCUMENTS 62-165980  7/1987  Japan.
1-144617  6/1989  Japan.

*Primary Examiner*—Tom Thomas
*Assistant Examiner*—Fetsum Abraham
*Attorney, Agent, or Firm*—Sughrue, Mion, Zinn, Macpeak & Seas, PLLC

[57] ABSTRACT

Disclosed is a semiconductor device, which is used as an optical detector and has: a photodiode section which has a first silicon layer, a light-absorbing layer and a second silicon layer which are in turn layered on a silicon substrate; wherein the light-absorbing layer is formed as a single silicon-germanium epitaxial layer and the single silicon-germanium epitaxial layer has a germanium concentration distribution which provides germanium concentrations of zero at its interfaces to the first silicon layer and the second silicon layer and provides a triangle-shaped concentration profile that a peak concentration value is provided in the middle of the single silicon-germanium epitaxial layer.

24 Claims, 6 Drawing Sheets

- 11 SEMICONDUCTOR DEVICE
- 17 SILICON DIOXIDE FILM
- 18 CONTACT
- 19 ALUMINUM ELECTRODE
- 16 N⁺-TYPE SILICON CONTACT LAYER
- 15 UPPER SILICON LAYER
- LIGHT
- 14 SiGe EPITAXIAL LAYER
- 13 LOWER SILICON LAYER
- 12 P⁺-TYPE SILICON SUBSTRATE

Ge CONCENTRATION

- 16 N⁺-TYPE SILICON CONTACT LAYER
- 15 UPPER SILICON LAYER
- 14 SiGe EPITAXIAL LAYER
- 13 LOWER SILICON LAYER
- 12 P⁺-TYPE SILICON SUBSTRATE

17 SILICON DIOXIDE FILM

CLEAVAGE POSITION

- 16 N⁺-TYPE SILICON CONTACT LAYER
- 15 UPPER SILICON LAYER
- 21 Si/SiGe SUPER-LATTICE LAYER
- 13 LOWER SILICON LAYER
- 12 P⁺-TYPE SILICON SUBSTRATE

17 SILICON DIOXIDE FILM

CLEAVAGE POSITION

SEMICONDUCTOR DEVICE HAVING A GESC LAYER BETWEEN SILICON LAYERS WITH TRIANGULAR GE CONCENTRATION

FIELD OF THE INVENTION

This invention relates to a semiconductor device, and more particularly to, a semiconductor device which is used as an optical detector and which has a photodiode structure including a silicon-germanium epitaxial layer.

BACKGROUND OF THE INVENTION

Typically used as an optical detector in optical communication system is a photodiode which is composed of a III–V system compound, e.g., InGaAsP. On the other hand, from the point of well matching with the silicon processing, a photodiode in which silicon-germanium(hereinafter referred to as 'SiGe') is used as a light-absorbing layer has been developed.

The problem in SiGe growth onto a silicon(hereinafter referred to as 'Si') substrate is in that there occurs a crystal defect due to its high lattice mismatch. In this regard, U.S. Pat. No. 4,529,455 (J. C. Bean et al.) discloses a method for growing a BOX-type SiGe layer with a critical film thickness. As a solution of the above problem caused by thickening a SiGe layer as a light-absorbing layer, Japanese patent application laid-open No. 62-165980 (1987) (J. C. Bean et al.) discloses a photodiode technique in which a Si/SiGe superlattice layer alternately layered of Si layers and SiGe layers is employed. In this device, since the total film thickness of the light-absorbing layer of SiGe is increased by employing the superlattice structure, the photoelectric conversion efficiency can be enhanced. With regard to such SiGe growth method, Japanese patent application laid-open No. 1-144617 (1989) (K. J. Lindberg) discloses a continuous growth method of superlattice layer.

FIG. 1 is a cross sectional view showing the device composition of an optical detector grown by the method of J. C. Bean et al. In this device, a Si/SiGe superlattice layer 3 is grown on a P$^+$-type silicon substrate 1, further growing a N$^+$-type silicon contact layer, whereby a photodiode is formed. In this structure, the Si/SiGe superlattice layer 3 as light-absorbing layer is depleted by reversely applying an voltage, whereby incident light is converted into electricity. As shown in FIG. 1, a Ge concentration distribution in the superlattice layer 3 has a BOX type of profile. Since the total film thickness of the light-absorbing layer prepared by employing the superlattice structure is thicker than that in case of stacking with single layers, light-receiving area can be enlarged, thereby increasing the quantum efficiency.

FIG. 2 is a cross sectional view showing the device composition of an optical detector grown by the method of K. J. Lindberg et al. and a Ge concentration profile in a SiGe epitaxial layer 8. Since it has the concentration profile that periodically changes, as shown in FIG. 2, by varying a gas flow rate in an apparatus, a thicker SiGe layer can be grown.

However, in the above conventional photodiodes using the superlattice, there are some problems as described below.

The first problem is that the superlattice structure device produced by the method of J. C. Bean et al. has a low productivity due to a low growth rate of the Si/SiGe layer. This is because the Ge concentration profile in SiGe layer is of a BOX type and Si layers with a very low growth rate need to be grown between the SiGe layers. The second problem is that the superlattice structure device produced by the method of K. J. Lindberg et al. is likely to be highly affected by heat treatment after growth, thereby occurring a leakage current. This is because the crystal defect due to lattice mismatch may occur during the continuous growth of a thick SiGe layer.

SUMMARY OF THE INVENTION

Accordingly, it is an object of the invention to provide a semiconductor device with a good productivity.

It is a further object of the invention to provide a semiconductor device in which the occurrence of crystal defect can be suppressed.

According to the invention, a semiconductor device, which is used as an optical detector, comprises:

a photodiode section which is composed of a first silicon layer, a light-absorbing layer and a second silicon layer which are in turn layered on a silicon substrate;

wherein the light-absorbing layer is formed as a single silicon-germanium epitaxial layer and the single silicon-germanium epitaxial layer has a germanium concentration distribution which provides germanium concentrations of zero at its interfaces to the first silicon layer and the second silicon layer and provides a triangle-shaped concentration profile that a peak concentration value is provided in the middle of the single silicon-germanium epitaxial layer.

In the semiconductor device of the above-mentioned invention, since the SiGe epitaxial layer which composes the light-absorbing layer has a triangle-shaped Ge concentration distribution, a part with relatively low Ge concentration can absorb light to some degree and a part with relatively high Ge concentration can sufficiently absorb light. As a result, thickening of the SiGe epitaxial layer can be substantially achieved. Moreover, since the growth rate of forming the single SiGe epitaxial layer is higher than that of a Si epitaxial layer, the productivity can be enhanced.

According to another aspect of the invention, a semiconductor device, which is used as an optical detector, comprises:

a photodiode section which is composed of a first silicon layer, a light-absorbing layer and a second silicon layer which are in turn layered on a silicon substrate;

wherein the light-absorbing layer is formed as a silicon/silicon-germanium superlattice layer in which a silicon epitaxial layer and a silicon-germanium epitaxial layer are alternately layered and the silicon-germanium epitaxial layer of the silicon/silicon-germanium superlattice layer has a germanium concentration distribution which provides germanium concentrations of zero at its interface to the silicon epitaxial layer and provides a triangle-shaped concentration profile that a peak concentration value is provided in the middle of the silicon-germanium epitaxial layer.

In the semiconductor device of the above-mentioned invention, substantial thickening of the SiGe epitaxial layer can be achieved by employing the Si/SiGe superlattice layer. Moreover, since the Si epitaxial layer is always sandwiched between adjacent two Si epitaxial layers, occurrence of crystal defect due to thickening can be suppressed, thereby reducing a leakage current.

BRIEF DESCRIPTION OF THE DRAWINGS

The invention will be explained in more detail in conjunction with the appended drawings, wherein.

DESCRIPTION OF THE PREFERRED EMBODIMENTS

A semiconductor device in the first preferred embodiment according to the invention will be explained in FIGS. 3A to 4B.

Figure 1:
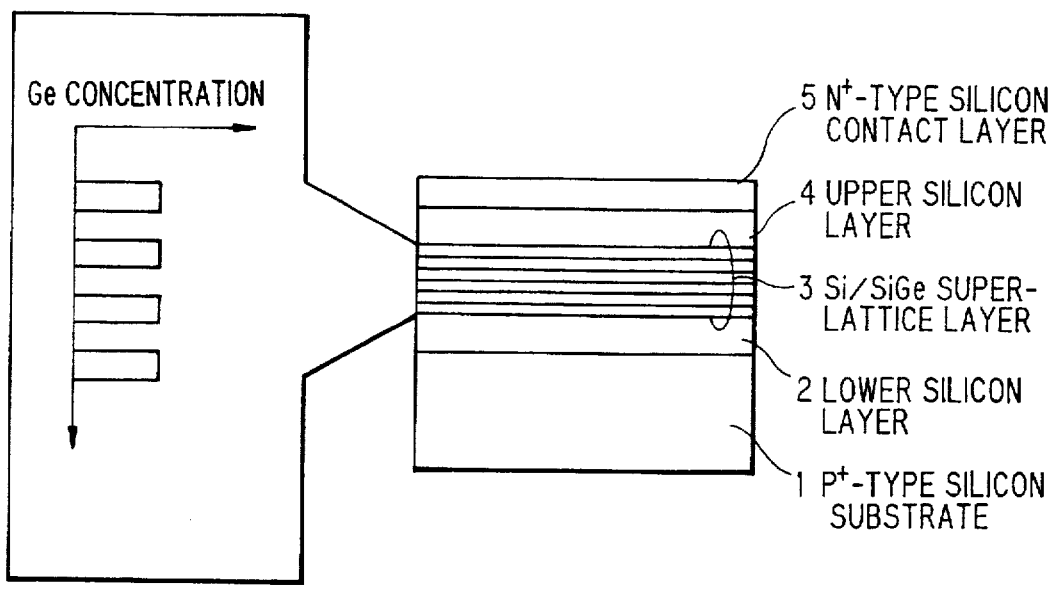
FIG. 1 is a cross sectional view showing a conventional optical detector.
Figure 2:
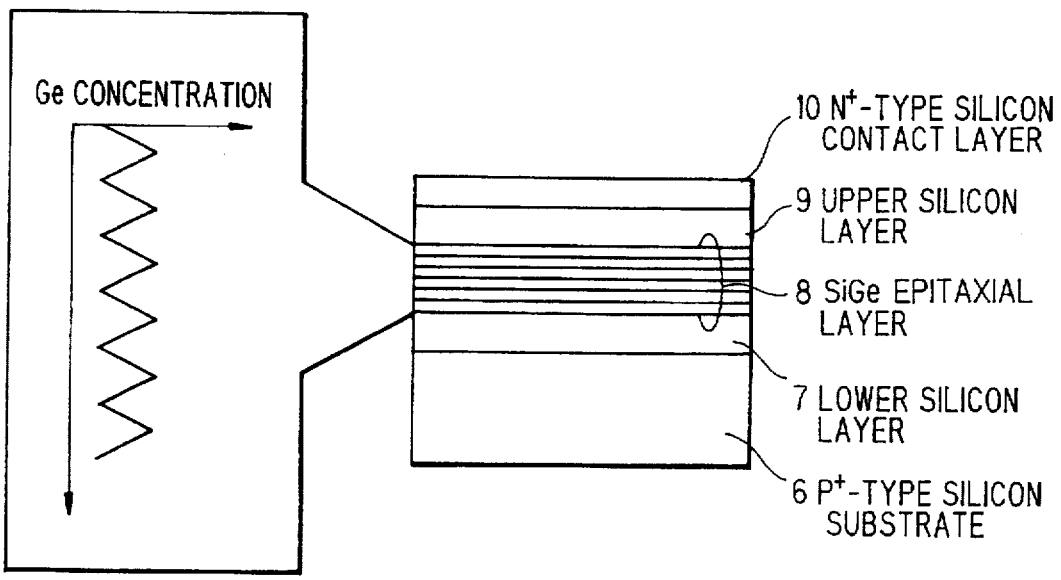
FIG. 2 is a cross sectional view showing another conventional optical detector.
Figure 3A:
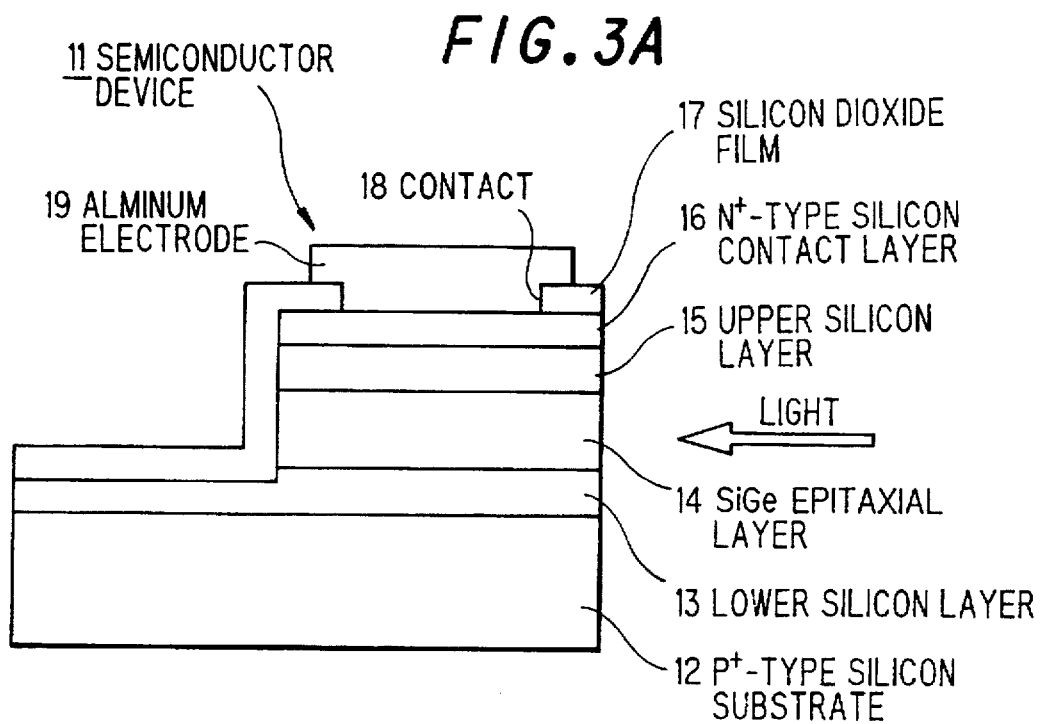
FIG. 3A is a cross sectional view showing a semiconductor device in a first preferred embodiment according to the invention.

FIG. 3A is a cross sectional view of the semiconductor device 11 in the first embodiment, which is formed as an optical detector in which a photodiode section with a mesa structure is formed on a P$^+$-type silicon substrate.

As shown in FIG. 3A, a lower silicon layer 13 (first silicon layer) is formed on a P$^+$-type silicon substrate 12, and formed in sequence thereon are a SiGe epitaxial layer 14 (light-absorbing layer), an upper silicon layer 15( second silicon layer) and a N$^+$-type silicon contact layer 16, wherein the N$^+$-type silicon contact layer 16 to upper part of the lower silicon layer 13 are formed as a mesa structure. Then, these are covered with silicon dioxide film 17, boring a contact 18, forming an aluminum electrode 19 contacting the N$^+$-type silicon contact layer 16. An end surface to which light is introduced is provided by a cleavage plane which is obtained by cleaving the silicon chip.

Figure 3B:
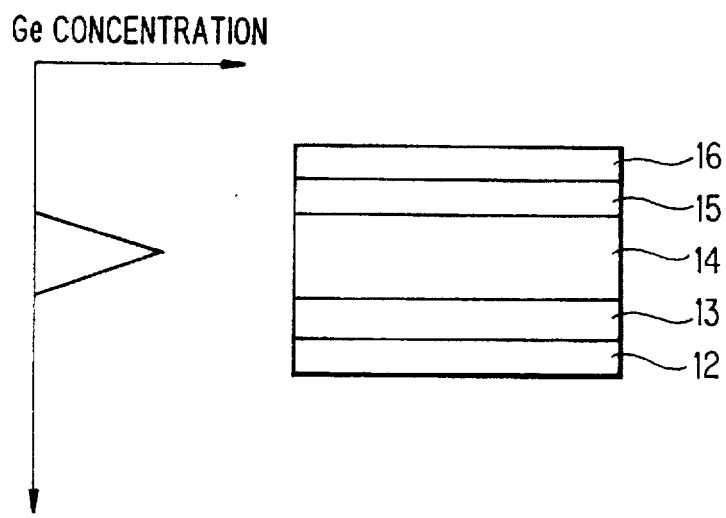
FIG. 3B shows a relationship between a depth of light-absorbing layer and a Ge concentration in the semiconductor device in the first embodiment.

FIG. 3B shows a relationship between a depth of a light-absorbing layer in the photodiode section and a Ge concentration.

As shown, the semiconductor device 11 has a Ge concentration distribution in the SiGe epitaxial layer 14 that Ge concentrations at the interfaces to the upper silicon layer 15 and the lower silicon layer 13 are zero and there is a peak value of at the middle of the depth, thereby forming a triangle.

Figure 4A:
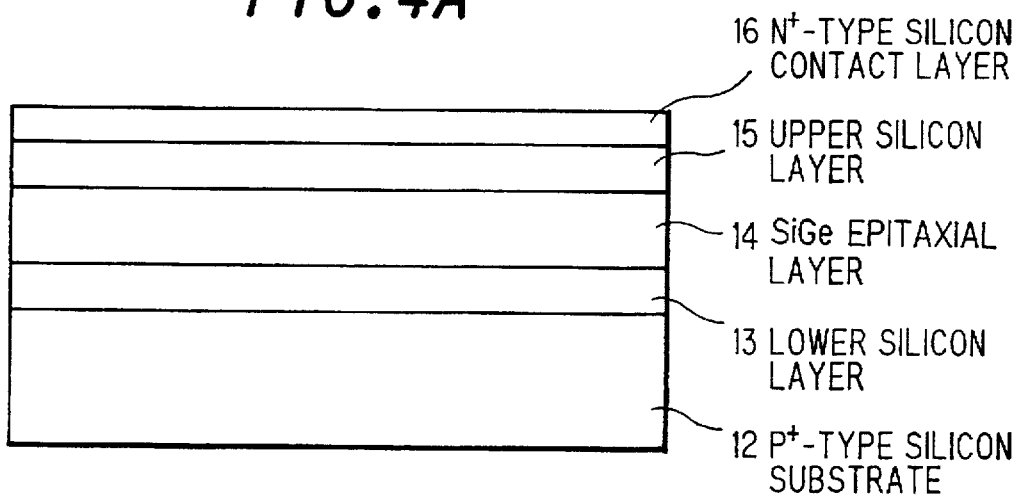
FIG. 4A and 4B are cross sectional views showing a production process of the semiconductor device in the first embodiment.

Next, a production process of the semiconductor device 11 in the first embodiment will be explained in FIGS. 4A and 4B. First, as shown in FIG. 4A, the lower silicon layer 13 is grown by around 1.0 μm on the P$^+$-type silicon substrate 12, thereafter growing the SiGe epitaxial layer 14 up to, e.g., 1.0 μm thickness with monotonously increasing its Ge concentration and growing it from there to 2.0 μm thickness with monotonously decreasing its Ge concentration, whereby the triangle-shape concentration distribution as shown in FIG. 3B is obtained. Then, the upper silicon layer 15 is grown by around 1.0 μm thereon, thereafter growing the N$^+$-type silicon contact layer 16.

Figure 4B:
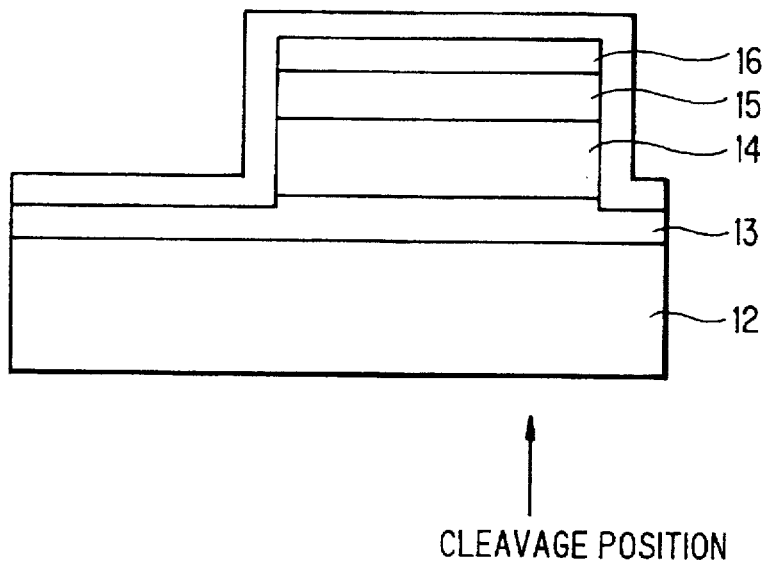

Then, as shown in FIG. 4B, to leave a region for forming a photodiode, the mesa-etching from the surface of the N$^+$-type silicon contact layer 16 up to the lower silicon layer 13 is conducted, thereafter covering the entire surface with the silicon dioxide film 17. Then, after the silicon dioxide film 17 on the N$^+$-type silicon contact layer 16 is partially bored, the aluminum electrode 19 as an upper electrode is formed. Thereafter, a part of the photodiode section is cleaved to provide a light-receiving surface, whereby the semiconductor device as shown in FIG. 3A is obtained.

Meanwhile, as explained before, the greater the Ge concentration in a SiGe layer is, the higher the lattice mismatch with silicon is. Thereby, the crystal defect in the SiGe layer will be increased and its critical film thickness will be thinner. In the first embodiment, as shown in FIG. 3B, the Ge concentration is gradually increased in the direction from the interface of the SiGe epitaxial layer 14 and the lower silicon layer 13 or upper silicon layer to the middle part of the SiGe epitaxial layer 14. Therefore, the lattice mismatch at the interfaces to silicon can be significantly relaxed as compared to the case of BOX-type, thereby increasing its substantial SiGe film thickness. As a result, the sectional area of the light-receiving part can be increased and the photoelectric conversion efficiency can be enhanced. Moreover, since the growth rate of the SiGe epitaxial layer 14 is higher than that of the silicon layer, the productivity can be improved as compared to that in the conventional optical detector with BOX-type concentration distribution.

Figure 5A:
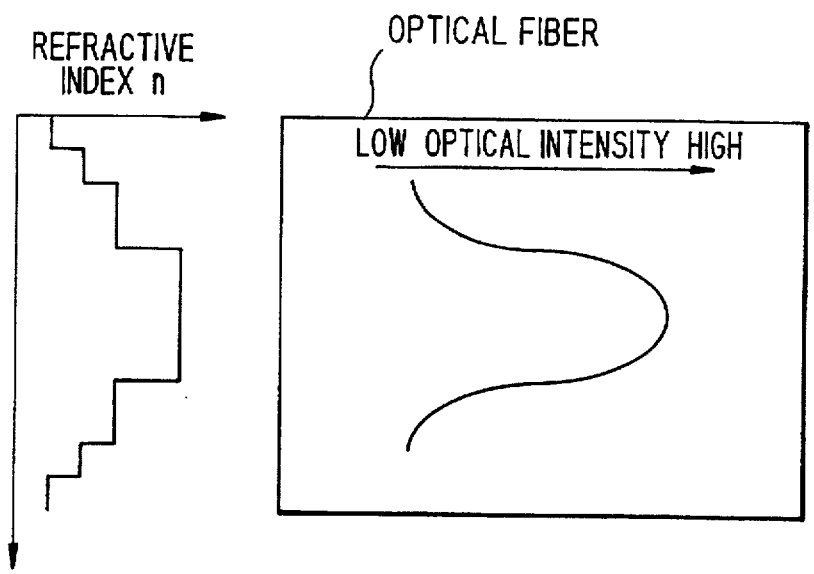
FIG. 5A shows a relationship between a refractive index and a distribution of optical intensity in an optical fiber.

On the other hand, when light is transmitted through an optical fiber which is a light-introducing source, the light has a constant optical intensity distribution as shown in FIG. 5A.

Figure 5B:
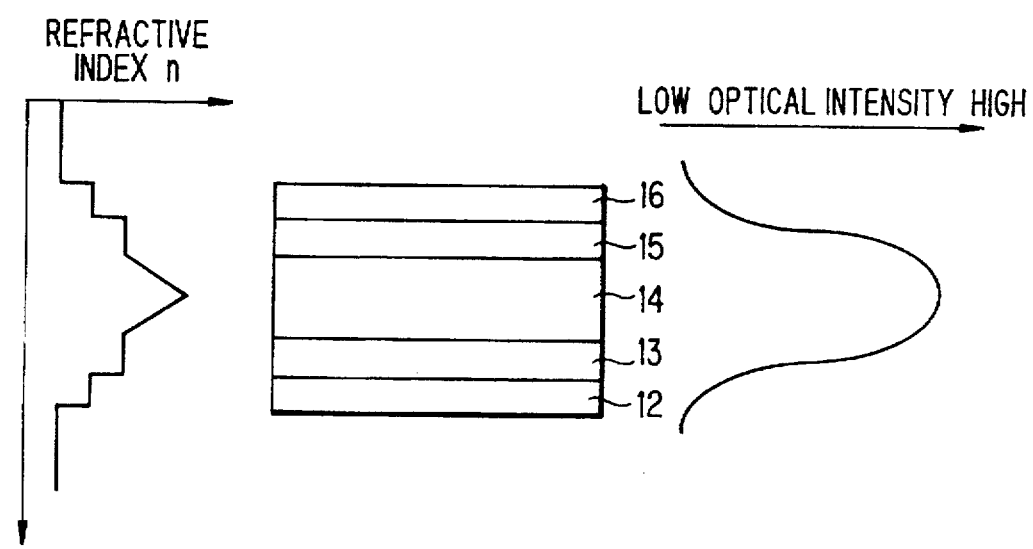
FIG. 5B shows a relationship between a refractive index and a distribution of optical intensity in the semiconductor device in the first embodiment.

This is because the light is confined due to the core having a refractive index higher than that of the cladding layer. Here, when there exists a triangle-shape Ge concentration distribution in the SiGe epitaxial layer 14 of the photodiode section as illustrated in the first embodiment, there is provided, as shown in FIG. 5B, a refractive index distribution that a refractive index n is given by n=3.5+0.38x, where x represents a Ge content ratio in the SiGe epitaxial layer. Thus, the semiconductor device in this embodiment has also a sufficient light confinement effect that light is confined with a peak at the highest refractive index, therefore providing a good matching with an optical fiber. If silicon layers with a low refractive index are grown just under and on the SiGe epitaxial layer 14, the light confinement effect becomes maximum. Furthermore, if the silicon layer 13, 15 just under and on the SiGe epitaxial layer 14 are so-called non-doped layers with no impurity implanted, the difference of refractive index is further increased and the light confinement effect is also enhanced.

In optical communication field, light with a wavelength of 0.98 μm, 1.3 μm or 1.55 μm is used depending on characteristics of optical fiber. In this connection, using the semiconductor device 11 in the first embodiment, the sensitivity of photodiode is assessed while a peak value of the Ge concentration in the SiGe epitaxial layer 14 is varied. As a result, it is proved that, to get the sensitivity of photodiode with a quantum efficiency more than 10% that satisfies a practical level, it is necessary for the peak value of Ge concentration to be at least more than 8 atomic weight %. Also, it is proved that, in case of using light with a greater wavelength, it is necessary for the peak value of Ge concentration to be higher.

A semiconductor device in the second preferred embodiment according to the invention will be explained in FIGS. 6A to 7B.

Figure 6A:
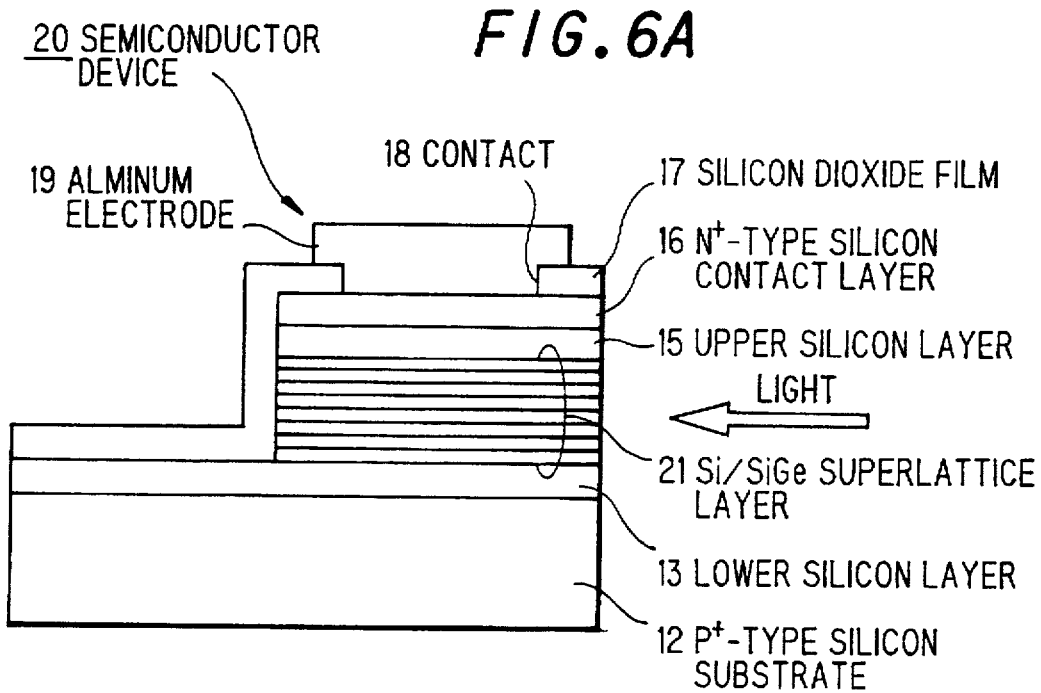
FIG. 6A is a cross sectional view showing a semiconductor device in a second preferred embodiment according to the invention.

FIG. 6A shows a cross sectional view of the semiconductor device 20 in the second embodiment, wherein like parts are indicated by like reference numerals as used in FIG. 3A. The semiconductor device 20, similarly to the first embodiment, comprises a mesa structure photodiode, but it is different from the first embodiment in that a Si/SiGe superlattice layer is used as a light-absorbing layer instead of the SiGe epitaxial layer 14.

As shown in FIG. 6A, a lower silicon layer 13 is formed on a $P^+$-type silicon substrate 12, and formed in sequence thereon are a Si/SiGe superlattice layer 21, an upper silicon layer 15 and a $N^+$-type silicon contact layer 16, wherein the $N^+$-type silicon contact layer 16 to upper part of the lower silicon layer 13 are formed as a mesa structure. Then, these are covered with silicon dioxide film 17, boring a contact 18, forming an aluminum electrode 19 contacting the $N^+$-type silicon contact layer 16. An end surface to which light is introduced is provided by a cleavage plane which is obtained by cleaving the silicon chip.

Figure 6B:
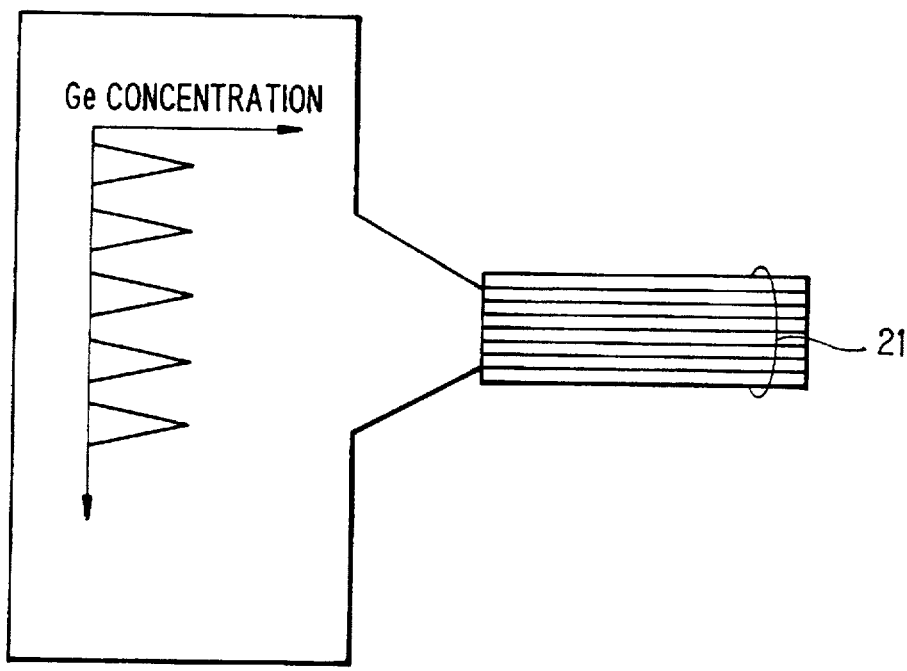
FIG. 6B shows a relationship between a depth of light-absorbing layer and a Ge concentration in the semiconductor device in the second embodiment.

FIG. 6B shows a relationship between a depth of a light-absorbing layer in the photodiode section and a Ge concentration. As shown, different from the first embodiment, the semiconductor device 20 has a Ge concentration distribution in the Si/SiGe superlattice layer 21 that Ge concentrations of the respective SiGe epitaxial layers at the interfaces to the lower and upper Si epitaxial layers with Ge concentrations of zero are zero and there are peak values of at the middle of the respective SiGe epitaxial layers, thereby forming triangles.

Figure 7A:
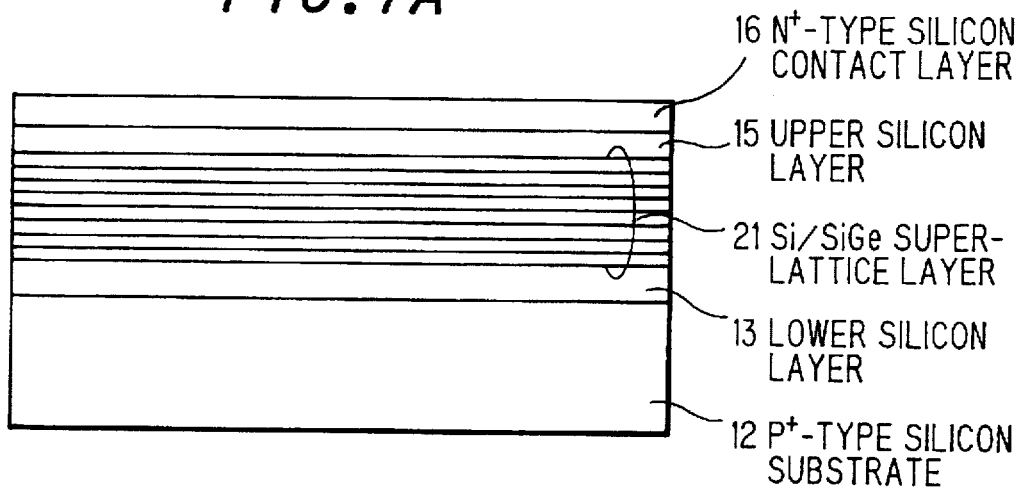
FIG. 7A and 7B are cross sectional views showing a production process of the semiconductor device in the second embodiment.

Next, a production process of the semiconductor device 20 in the second embodiment will be explained in FIGS. 7A and 7B. First, as shown in FIG. 7A, the lower silicon layer 13 is grown by around 1.0 μm on the $P^+$-type silicon substrate 12, thereafter growing the SiGe epitaxial layer up to the middle of its film thickness with monotonously increasing its Ge concentration and growing it from there with monotonously decreasing its Ge concentration. Then, the SiGe epitaxial layer and Si epitaxial layer, each of which has a thickness of, e.g., 50 nm, are alternately grown to provide its total layer number of around 20 to 40, whereby the Si/SiGe superlattice layer 21 which has a thickness of around 1.0 to 2.0 μm and has the Ge concentration distribution as shown in FIG. 6B is obtained. Then, the upper silicon layer 15 is grown by around 1.0 μm thereon, thereafter growing the $N^+$-type silicon contact layer 16.

Figure 7B:
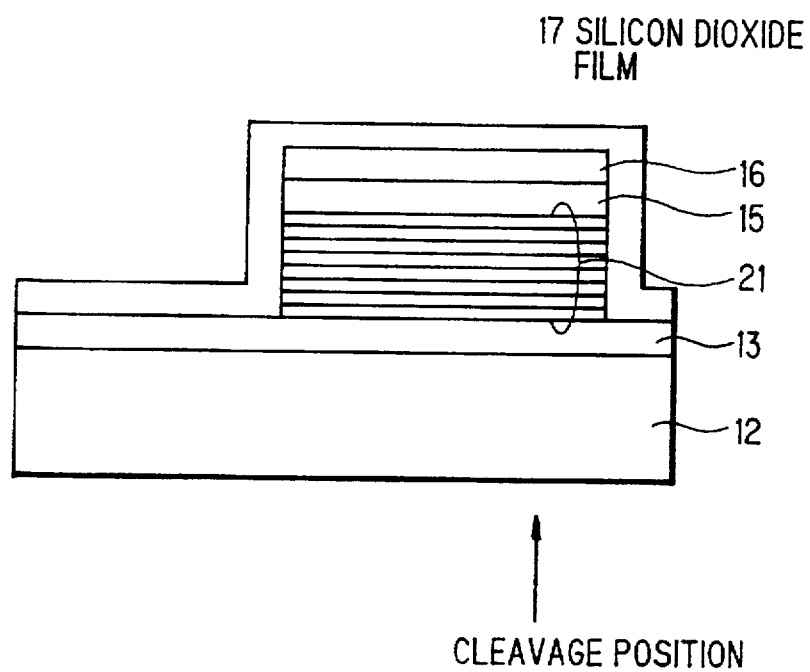

Then, as shown in FIG. 7B, to leave a region for forming a photodiode, the mesa-etching from the surface of the $N^+$-type silicon contact layer 16 up to the lower silicon layer 13 is conducted, thereafter covering the entire surface with the silicon dioxide film 17. Then, after the silicon dioxide film 17 on the $N^+$-type silicon contact layer 16 is partially bored, the aluminum electrode 19 as an upper electrode is formed. Thereafter, a part of the photodiode section is cleaved to provide a light-receiving surface, whereby the semiconductor device as shown in FIG. 6A is obtained.

Also in the second embodiment, by providing the Si/SiGe superlattice layer 21, the Ge concentration is gradually increased in the direction from the interface of the Si epitaxial layer and the SiGe epitaxial layer to the middle part of the SiGe epitaxial layer. Therefore, the lattice mismatch at the interfaces of the Si epitaxial layer and the SiGe epitaxial layer can be significantly relaxed, thereby increasing its substantial SiGe film thickness. As a result, similarly to the first embodiment, the sectional area of the light-receiving part can be increased and the photoelectric conversion efficiency can be enhanced.

Next, its light confinement effect will be discussed below.

If the peak of Ge concentration in the semiconductor device 11 of the first embodiment as shown in FIG. 3B is equal to the peak of Ge concentration in the semiconductor device 20 of the second embodiment as shown in FIG. 6B, refractive index at the middle of the whole light-absorbing layer in the semiconductor device 20 of the second embodiment is lower on average since the semiconductor device 20 includes regions with a concentration of zero, therefore resulting in reducing the light confinement effect. However, in the second embodiment, the sectional area of the light-absorbing layer can be substantially enlarged by employing the Si/SiGe superlattice structure, thereby providing an optical detector advantageous to the case that an optical fiber with a large numerical aperture is connected.

Though the semiconductor devices 11 and 20 in the above embodiments have the photodiode sections with mesa structure, they may have a planar type of photodiode section. Further, the conductivity types of the substrate and silicon contact layer, which are P-type and N-type, respectively in the above embodiments, may be N-type and P-type, respectively.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, which is used as an optical detector, comprising:

a photodiode section which is composed of a first silicon layer, a light-absorbing layer and a second silicon layer which are in turn layered on a silicon substrate;

wherein said light-absorbing layer is formed as a single silicon-germanium epitaxial layer and said single silicon-germanium epitaxial layer has a germanium concentration distribution which provides germanium concentrations of zero at its interfaces to said first silicon layer and said second silicon layer and provides a triangle-shaped concentration profile that a peak concentration value is provided in the middle of said single silicon-germanium epitaxial layer.

2. A semiconductor device, according to claim 1, wherein: said first and second silicon layers are non-doped layers.

3. A semiconductor device, according to claim 2, wherein: said photodiode section has a mesa-type structure.

4. A semiconductor device, according to claim 3, wherein: said peak concentration value in the middle of said silicon-germanium epitaxial layer is eight atomic weight % or more.

5. A semiconductor device, according to claim 2, wherein: said photodiode section has a planar-type structure.

6. A semiconductor device, according to claim 5, wherein: said peak concentration value in the middle of said silicon-germanium epitaxial layer is eight atomic weight % or more.

7. A semiconductor device, according to claim 2, wherein: said peak concentration value in the middle of said silicon-germanium epitaxial layer is eight atomic weight % or more.

8. A semiconductor device, according to claim 1, wherein:

said photodiode section has a mesa-type structure.

9. A semiconductor device, according to claim 8, wherein:

said peak concentration value in the middle of said silicon-germanium epitaxial layer is eight atomic weight % or more.

10. A semiconductor device, according to claim 1, wherein:

said photodiode section has a planar-type structure.

11. A semiconductor device, according to claim 10, wherein:

said peak concentration value in the middle of said silicon-germanium epitaxial layer is eight atomic weight % or more.

12. A semiconductor device, according to claim 1, wherein:

said peak concentration value in the middle of said silicon-germanium epitaxial layer is eight atomic weight % or more.

13. A semiconductor device, which is used as an optical detector, comprising:

a photodiode section which is composed of a first silicon layer, a light-absorbing layer and a second silicon layer which are in turn layered on a silicon substrate;

wherein said light-absorbing layer is formed as a silicon/silicon-germanium superlattice layer in which a silicon epitaxial layer and a silicon-germanium epitaxial layer are alternately layered and said silicon-germanium epitaxial layer of said silicon/silicon-germanium superlattice layer has a germanium concentration distribution which provides germanium concentrations of zero at its interface to said silicon epitaxial layer and provides a triangle-shaped concentration profile that a peak concentration value is provided in the middle of said silicon-germanium epitaxial layer.

14. A semiconductor device, according to claim 13, wherein:

said first and second silicon layers are non-doped layers.

15. A semiconductor device, according to claim 14, wherein:

said photodiode section has a mesa-type structure.

16. A semiconductor device, according to claim 15, wherein:

said peak concentration value in the middle of said silicon-germanium epitaxial layer is eight atomic weight % or more.

17. A semiconductor device, according to claim 14, wherein:

said photodiode section has a planar-type structure.

18. A semiconductor device, according to claim 17, wherein:

said peak concentration value in the middle of said silicon-germanium epitaxial layer is eight atomic weight % or more.

19. A semiconductor device, according to claim 14, wherein:

said peak concentration value in the middle of said silicon-germanium epitaxial layer is eight atomic weight % or more.

20. A semiconductor device, according to claim 13, wherein:

said photodiode section has a mesa-type structure.

21. A semiconductor device, according to claim 20, wherein:

said peak concentration value in the middle of said silicon-germanium epitaxial layer is eight atomic weight % or more.

22. A semiconductor device, according to claim 13, wherein:

said photodiode section has a planar-type structure.

23. A semiconductor device, according to claim 22, wherein:

said peak concentration value in the middle of said silicon-germanium epitaxial layer is eight atomic weight % or more.

24. A semiconductor device, according to claim 13, wherein:

said peak concentration value in the middle of said silicon-germanium epitaxial layer is eight atomic weight % or more.

* * * * *